United States Patent [19]

Thiele et al.

[11] 3,943,426
[45] Mar. 9, 1976

[54] THYRISTOR COLUMN
[75] Inventors: Gerd Thiele, Erlangen-Frauenaurach; Erwin Keyl, Erlangen, both of Germany
[73] Assignee: Siemens Akteiengesellschaft, Munich, Germany
[22] Filed: Sept. 12, 1974
[21] Appl. No.: 505,262

[30] Foreign Application Priority Data
Sept. 25, 1973 Germany............................ 2348207

[52] U.S. Cl. ............................... 321/8 C; 336/175
[51] Int. Cl.² ......................................... H02M 7/00
[58] Field of Search............ 321/8 C, 11, 8 R, 27 R; 307/252 L; 336/175, 177

[56] References Cited
UNITED STATES PATENTS

| | | |
|---|---|---|
| 476,816 | 6/1892 | Pfannkuche........................ 336/175 |
| 2,679,025 | 5/1954 | Rajchman et al.................... 336/175 |
| 2,891,212 | 6/1959 | Bingham............................. 336/175 |
| 3,042,849 | 7/1962 | Dortort............................... 336/175 |
| 3,386,027 | 5/1968 | Kilgore et al. ........................ 321/11 |

Primary Examiner—William M. Shoop
Attorney, Agent, or Firm—Kenyon & Kenyon Reilly Carr & Chapin

[57] ABSTRACT

The invention concerns a thyristor column with disc thyristors which are stacked on top of each other and are mounted resiliently. A heat sink, which serves simultaneously as a conductor of electric current, is interposed on each side of each disc thyristor. Between the heat sinks of succeeding disc thyristors, a spacer element is inserted, on which ferrite cores are lined up. In this embodiment, the transient current is limited by the choke formed by the spacer element and the ferrite cores. The resistors of the external R-C components can therefore be designed for less power.

5 Claims, 3 Drawing Figures

U.S. Patent  March 9, 1976  3,943,426

THYRISTOR COLUMN

BACKGROUND OF THE INVENTION

1. Field of the Invention

The invention concerns a thyristor column with disc thyristors which are stacked on top of each other and are mounted resiliently. Heat sinks serve simultaneously for the conduction of the electric current, and are interposed on each side of each disc thyristor.

2. Description of the Prior Art

Such thyristor columns are known, for instance, from the German Offenlegungsschrift No. 1,914,790. They find use where several disc thyristors are to be connected in series. The disc thyristors must then be protected against excessive currents by separate external circuit components. From the book "Siliziumstromrichter-Handbuch" (Silicon rectifier handbuch) of BBC, Baden, Switzerland, page 83, for instance, it is known to use for this purpose an R-L-C circuit, in which a common blocking choke precedes all the series-connected disc thyristors and each thyristor of the thyristor column is shunted by an R-C member. The blocking choke, which is always common to several thyristors takes a large volume and has considerable weight, whereby the volume and the weight of the equipment, in which the thyristor column is to be installed, is greatly influenced. In this circuit arrangement, the resistors of the R-C members must, furthermore, be designed for relatively large power.

The object of this invention is to provide a thyristor column of the kind mentioned at the outset in such a manner that the external circuit can be provided at low cost, saves space and does not add appreciably more weight.

DESCRIPTION OF THE INVENTION

This invention provides that between heat sinks of succeeding disc thyristors at least one spacer element each is interposed and that the space formed by the spacer element is bridged by an electric conductor which is equipped with ferrite cores. Toroidal cores are preferably provided as the ferrite cores, which are lined up on the conductor.

In the thyristor stack according to the invention, a separate blocking choke is provided as an external circuit component for each thyristor. This separate blocking choke for each thyristor is formed by the conductor and the ferrite cores which are disposed in the space defined by the spacer element. The spacer element transmits the pressure force necessary for providing contact for the disc thyristors without affecting the ferrite cores. It is advantageous to design the spacer element as an electrical conductor, on which the ferrite cores are lined up.

In connecting external components to the thyristor column according to the invention, current limitation is achieved, when the thyristors are switched on, by a separate blocking choke associated with each thyristor and not, as in the prior art, by the resistors. The resistors of the R C members can therefore be designed for less power. In addition, the large volume required in the known connection for the common blocking choke is substantially reduced, as the separate blocking chokes built up with the ferrite cores require less space than a common blocking choke. In order to reduce the volume further, the ferrite cores can be arranged concentrically with each other.

Figure 1:
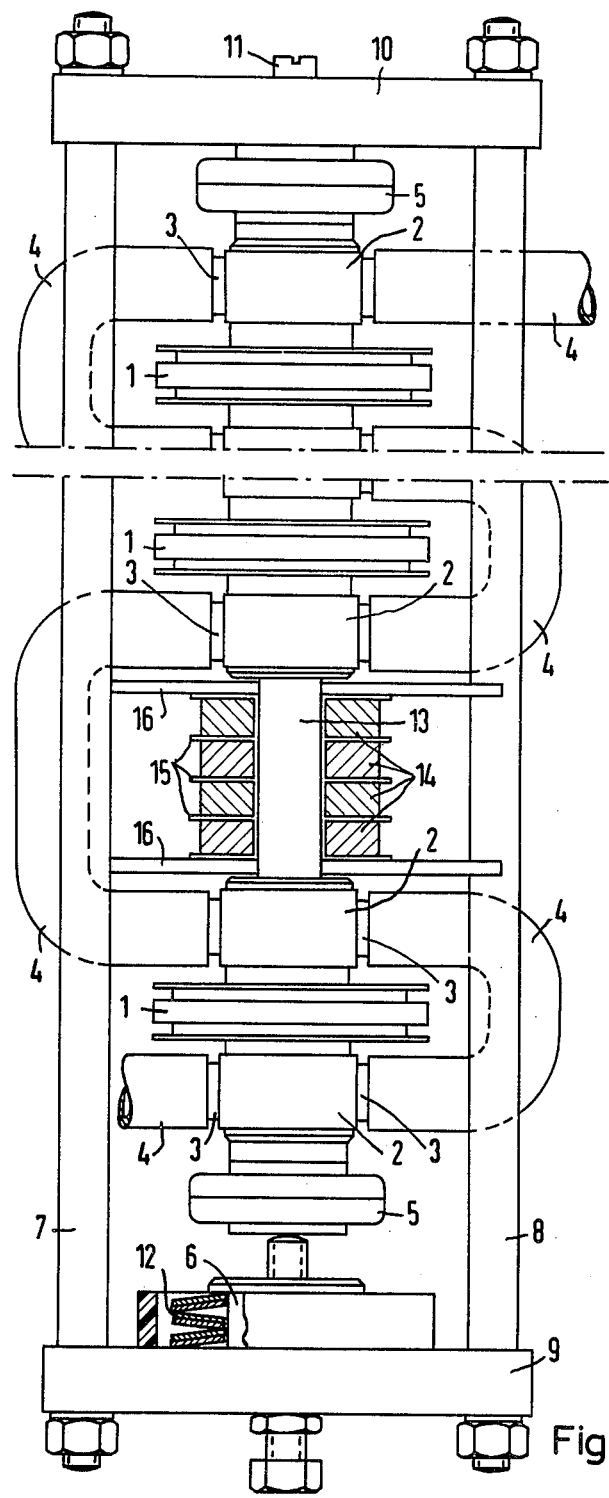
FIG. 1 shows several series-connected disc thyristors with associated heat sinks and spacer elements around which are fitted ferrite cores.

The thyristor column shown in FIG. 1 contains several series-connected disc thyristors 1, with a heat sink 2 provided next to each disc thyristor. In the example of the embodiment, a liquid-cooled thyristor column is depicted. Heat sinks for liquid-cooling such a thyristor column are known, for instance, from the German Offenlegungsschrift No. 2,160,302. Line sections 4 are placed on contact posts 3 of the heat sinks 2. This forms the flow path for the liquid cooling medium, in which at least part of the thyristors of the thyristor column are thermally connected in series.

By means of insulators 5 and a pressure element 6, the disc thyristors 1 and the heat sinks 2 are clamped in a frame which is essentially formed by two threaded bolts 7 and 8 and two clamping plates 9 and 10. One of the insulators 5 is connected with the clamping plate 10 by a screw 11, and the other insulator 5 rests on the pressure element 6. Regarding the design of the pressure element, reference is made by way of example to the above-mentioned German Offenlegungsschrift No. 1,914,790. The pressure element 6 comprises essentially cup springs 12 as energy storage devices, which exert an elastic pressure force on the heat sinks and the disc thyristors, whereby electrical and thermal contact between the heat sinks and the disc thyristors is ensured. The electrical connections for the disc thyristors can be brought directly to the heat sinks 2, as is described, for instance, in the already mentioned German Offenlegungsschrift No. 2,160,302.

Between the heat sinks of two succeeding disc thyristors 1, a spacer element 13, which transmits the pressure force from one heat sink 2 to the following heat sink, is arranged in the example embodiment shown in FIG. 1. On the spacer element 13, which is made of electrically conductive material, toroidal cores 14 of ferrite are lined up, which are shown in cross section in FIG. 1. The toroidal cores 14 are separated by washers 15 and all toroidal cores which are arranged on a spacer element 13, are between two support washers 16 which are fastened at the bolts 7 and 8. The ferrite cores 14, together with the current-carrying spacer element 13, form a blocking choke.

Figure 2:
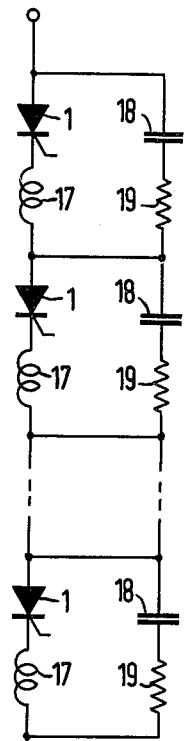
FIG. 2 is a schematic diagram showing series-connected thyristors with associated choke inductors and external R-C circuit elements.

The connection of external components to the thyristor column according to the invention is shown in FIG. 2. With each thyristor 1, a separate blocking choke 17 is associated, in addition to the connection of an R-C member 18, 19. Each blocking choke 17 is constructed of a conductor and ferrite cores 14, which are located in the space defined by the spacer element 13 between succeeding heat sinks 2. Here, the spacer element 13 may be the conductor, as in the example of the embodiment according to FIG. 1. It was already mentioned that in this circuit connection, contrary to the known connection mentioned, the current limitation is achieved not by the resistors 19 of the R-C members, but by the blocking choke 17 which is associated with each of the disc thyristors 1. This leads to the structural advantages which have already been discussed.

Figure 3:
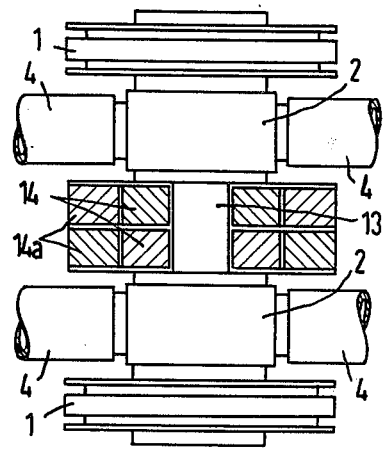
FIG. 3 shows a section from a thyristor column which depicts multiple concentric ferrite cores around the spacer element.

In FIG. 3, a section from a thyristor column according to the invention is shown which depicts a different arrangement of the ferrite cores. In this embodiment example, further ferrite cores 14a are concentrically added to the ferrite cores 14. The structural height of the thyristor column can be reduced thereby. In addition to the concentric arrangement of the ferrite cores 14 and 14a shown, other space-saving arrangements are, of course, also possible; it should further be mentioned in this connection that in addition to the spacer 13, a separate conductor can be provided for the ferrite cores 14 and that the blocking choke for each of the disc thyristors can be designed not only with toroidal cores, but also with other, commerically available ferrite cores.

In summary, it should be emphasized that with the thyristor column according to the invention, means have been provided which insure a space-saving installation of the thyristor column in an equipment and which simplifies the external components for the thyristors considerably.

What is claimed is:

1. A thyristor column having a column axis comprising:
   a first disc thyristor;
   two heat sinks stacked on either side of said first disc thyristor, said heat sinks being constructed of an electrically conducting material and providing electrical connection to said first thyristor, said heat sinks and the first thyristor being arranged along said column axis;
   at least a second disc thyristor;
   two further heat sinks stacked on either side of said second disc thyristor, said further heat sinks being constructed of an electrically conducting material and providing electrical connection to said second thyristor, said further heat sinks and the second thyristor being arranged along said column axis;
   at least one spacer element being arranged between one heat sink of said first disc thyristor and the succeeding further heat sink of said second disc thyristor;
   at least one electrical conductor being arranged between said one heat sink of said first disc thyristor and the succeeding further heat sink of said second disc thyristor; and
   at least one ferrite core fitting around said electrical conductor.

2. A thyristor column having a column axis comprising:
   a first disc thyristor;
   two heat sinks stacked on either side of said first disc thyristor, said heat sinks being constructed of an electrically conducting material and providing electrical connection to said first thyristor, said heat sinks and the first thyristor being arranged along said column axis;
   at least a second disc thyristor;
   two further heat sinks stacked on either side of said second disc thyristor, said further heat sinks being constructed of an electrically conducting material and providing electrical connection to said second thyristor, said further head sinks and the second thyristor being arranged along said column axis;
   at least one spacer element being constructed of a conducting material and providing electrical connection between one heat sink of said first disc thyristor and the succeeding further heat sink of said second disc thyristor; and
   at least one ferrite core fitting around said spacer element.

3. A thyristor column of claim 2 wherein more than two disc thyristors are stacked so that for each disc thyristor in the stack there is provided two associate heat sinks, one on each side of said thyristor and a spacer, each heat sink and spacer being electrically connected in series in the stack.

4. A thyristor column of claim 2 wherein one or more ferrite cores are fitted concentrically around said spacer element.

5. The thyristor column of claim 4 wherein said ferrite cores comprise first and second concentric rings, said second concentric rings being fitted concentrically about said first concentric rings.

* * * * *